United States Patent [19]
Behrin

[11] Patent Number: 5,459,422
[45] Date of Patent: Oct. 17, 1995

[54] EDGE SELECTIVE DELAY CIRCUIT

[75] Inventor: Michael N. Behrin, San Jose, Calif.

[73] Assignee: Advanced Micro Devices, Inc., Sunnyvale, Calif.

[21] Appl. No.: 70,674

[22] Filed: Jun. 2, 1993

[51] Int. Cl.⁶ .............................. H03H 11/26; H03K 5/06
[52] U.S. Cl. ........................ 327/276; 327/270; 327/281
[58] Field of Search ................................ 307/603, 597, 307/592, 594, 595, 602, 606, 268, 265, 234; 328/58, 55, 110; 327/269, 270, 271, 276, 277, 281, 284

[56] References Cited

U.S. PATENT DOCUMENTS

| | | | |
|---|---|---|---|
| 4,330,751 | 5/1982 | Swain | 328/58 |
| 4,675,562 | 6/1987 | Herlein et al. | 307/603 |
| 4,922,141 | 5/1990 | Lofgren et al. | 307/603 |
| 5,103,441 | 7/1992 | Yokogawa | 369/54 |
| 5,118,975 | 6/1992 | Hillis et al. | 307/597 |
| 5,204,559 | 4/1993 | Deyhimy et al. | 307/597 |
| 5,204,564 | 4/1993 | Ochiai | 307/603 |
| 5,210,450 | 5/1993 | Parkinson | 307/603 |
| 5,287,025 | 2/1994 | Nishimichi | 307/603 |

FOREIGN PATENT DOCUMENTS 0199540  10/1986  European Pat. Off. .
3636757  10/1987  Germany .

OTHER PUBLICATIONS

Patent Abstracts of Japan, vol. 13, No. 5 (E-701) 9 Jan. 1989 & JP-A-63 215 212 (NEC Corp.).
Patent Abstracts of Japan vol. 13, No. 378 (E-809) 22 Aug. 1989 & JP-A-01 128 612 (NEC Corp.).
1990 IEEE International Solid-State Circuits Conference, Digest of Technical Papers, Feb., 1990, San Francisco pp. 84–85, XP201835.

Primary Examiner—Timothy P. Callahan
Assistant Examiner—My-Trang Nu Ton
Attorney, Agent, or Firm—Gerald M. Fisher

[57] ABSTRACT

A digital circuit for independently controlling the delay of the falling edge and the delay of the rising edge of a digital signal which consist of two serially connected circuits which contain identical synchronous delay lines connected to a logical switch.

7 Claims, 3 Drawing Sheets

EDGE SELECTIVE DELAY CIRCUIT

FIELD OF THE INVENTION

This invention relates to an all digital method and apparatus for adjustment/regulation of the timing of the occurrence of the rising edges and the falling edges of pulses in a pulse train.

BACKGROUND OF THE INVENTION

In data transmission applications, delay elements are frequently used for clock synchronization, clock multiplication and clock/data recovery. In recent years digital technique's are displacing the analogue circuits which have been used in data recovery such as analogue phase locked loops. Digital techniques which enable selection of a variable delay length path through a plurality of short fixed time delay elements is being used to construct time delays used in data recovery circuits. This short fixed time delay element is typically provided by the propagation time of a signal through field effect transistors which are cascaded to achieve the desired length of delay. However, the delay value provided by these transistors are not stable enough for precise applications. The delay is a function of the manufacturing process and can vary as a function of the temperature and the power supply conditions.

One solution to this problem is to calibrate the delay and to design and include compensation circuits in the same circuit. Another approach would be to provide a method for measuring the delay and adjusting the delays in such circuits. Accordingly, delay circuits are needed in which pulse delays are measured and adjustable in response thereto.

Another problem in data recovery circuits relates to DC balance problems which requires modification of the duty cycle of serial data. This balance problem can result in errors in data recovery if the data is sampled at the wrong time as a result of duty cycle distortion. All of these problems can be corrected by delay techniques which can selectively and independently modify the rising edge and falling edge delays of a pulse transition.

SUMMARY OF THE INVENTION

A principal objective is to provide a cascaded delay line circuit which enables selective and independent control of both the delay of pulse rising transitions and/or pulse falling transitions of a binary signal.

A feature of the invention is that it is readily constructed in integrated circuit form and includes a falling edge delay block and a rising edge delay block and that both falling edge and rising edge blocks are identically constructed.

DETAINED DESCRIPTION OF THE INVENTION

Figure 1A:
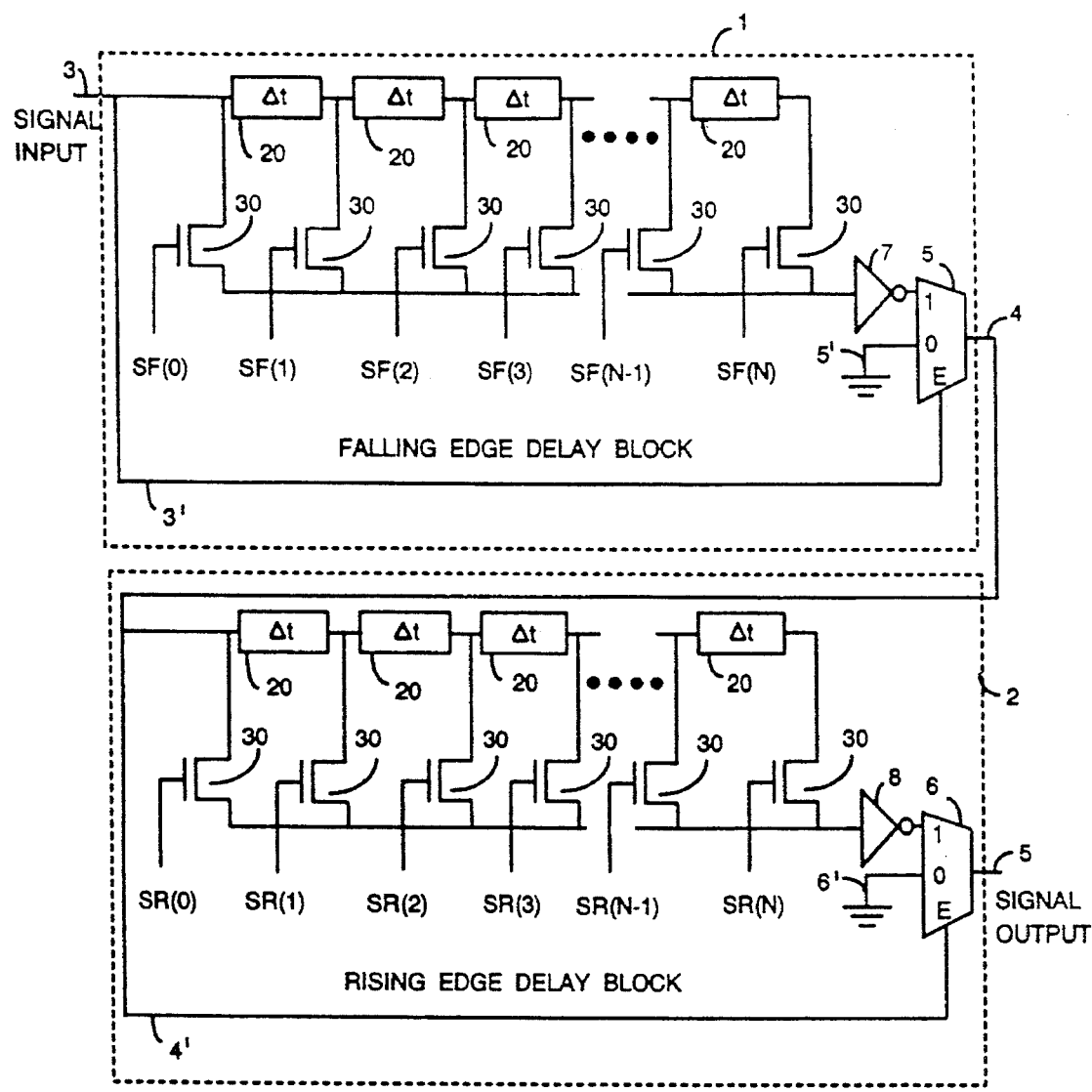
FIG. 1(a) is a schematic for the preferred invention.

With reference to FIG. 1A, an adjustable delay line is connected in series with a MUX 5 in block 1. The signal 3 into the delay line of the block 1 is connected to the MUX 5 Enable terminal and causes the MUX 5 to switch between a grounded input and the output of the delay line. Whenever the signal input 3 is high, i.e., +5 volts, the MUX 5 passes the grounded potential to its output 4. Accordingly, at the instant that the input signal 3 switches from high to low, the MUX 5 will be switched to be responsive to the delay line at its input. Since the signal introduced into the delay line at that instant goes from high to low, the falling edge will be propagating down the delay line and the timing of its arrival at the MUX 5 will be determined by the adjustable delay in block 1.

The delay line in block 1 consists of a series of delay units 20 and the output of each delay unit 20 is connected through a FET 30, in parallel, to the MUX 5 via inverter 7. The delay of the signal within the delay line is selectable by energizing a different one of the FET 30 and connecting that gate output to the inverter 7. Accordingly, by asserting a high, i.e., +5v on one of the conductors SF(O) . . . SF(N), and a low, i.e., ground, on the remaining control lines, the source of the selected gate is connected to the MUX. The delay time T1 applied to the input signal increases if the signal passes through a larger number of delay elements before it is selected by an energized gate 30.

The output of the block 1, however, is the input to block 2. Block 2 is the same as block 1 but block 2 controls the delay of the rise time of the subject signal input. Energization of one of the connecting lines, SF(O) . . . SF(N) to select one of the gates 30 will select the length of the delay time T2 in the same manner as described in respect to T1.

With reference to FIG. 1(a), it is seen that the Falling Edge Delay Block 1 (FEDB) is in series with the Rising Edge Delay Block 2 (REDB) and that the signal to be adjusted is input at Signal Input 3 of FEDB. The signal input to FEDB is applied to the first stage 20 of cascaded unit delay (Δt) circuits. The signal input is also applied via conductor 3' directly to MUX 5 to the enable E terminal. Whenever the signal input 3 is high, the MUX 5 is switched so that the ground 5' input connected to MUX 5 input 1 is sent to MUX output 4. MUX 5 output 4 is connected to the input of the E input of MUX 6 of the REDB 2. Accordingly, when Signal input 3 is high, MUX 5 selects input I and MUX 6 selects inputs 2. Therefore, the switch controls SR(O) . . . SR(N) of REDB determines the delay time T1 when the input signal goes from high to low, i.e. the falling edge.

Figure 2:
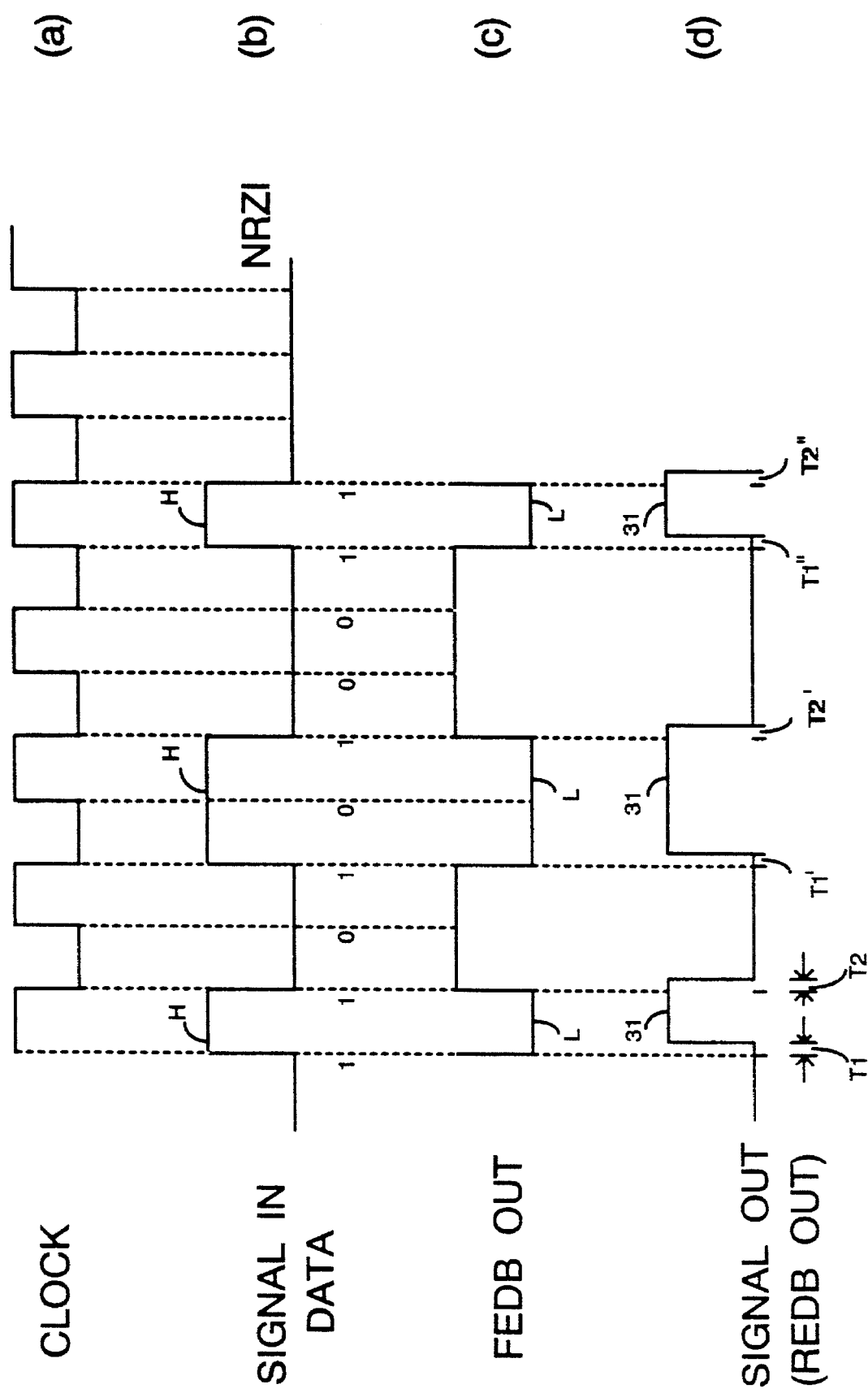
FIG. 2 is a timing diagram for the preferred embodiment of FIG. 1.

With reference to FIG. 2 timing diagrams, it can be understood how the delay T1 is generated. As illustrated in FIG. 2(b), for a NRZI formated data, when the Signal-in data changes to a high level, the FEDB out (MUX 5) switches the FEDB out 4 (FIG. 2(c)) to low. Output 4 is connected to MUX 6 enable and switches MUX 6 into the "1" input; Accordingly, whichever delay path is enabled through the cascaded unit delays of the REDB and then through inverter 8 will provide the REDB signal output 5. The delay path is selected by energizing one of the gates 30 via one of SR (O) . . . SR(N). The SR(O) . . . SR(N) can be provided from an external source not shown, such as a shift register which can have only one high level output. As seen from FIG. 2(d), by selection of one SR(n), the delay path and the of occurrence of the rising edges of pulses 31 are determined.

When the signal input 3 goes low, the MUX 5 switches to its nongrounded input "1" terminal, which is connected to the output of the inverter 7. Accordingly, the time of the next transition, the rising transition, is determined by the delay path from the Signal input to the inverter 7 which will be determined by which one of the control signals SF(O) . . . SF(N) is high to activate one of the gate transistors to select the path. When MUX 5 goes high, it will cause MUX 6 to select the lower grounded terminal input 6'.

Accordingly, as seen with reference to FIG. 2(d), the falling edge delay time T2 is established by the control signals SF(O) . . . SF(N).

It can be seen that these time delays T1 and T2 can be selected independently and are adjustable. Accordingly, the time delays can be adjusted as needed to compensate for temperature effects or other induced instabilities.

It is understood that the delay in both blocks are adjustable in discrete time steps as established by the delay unit 20. If SF(O) and SR(O) are enabled, the circuit is in its intrinsic mode because all the delay units 20 are by-passed so that minimum delay is applied to both the rising and falling edges of the signal.

Figure 1B:
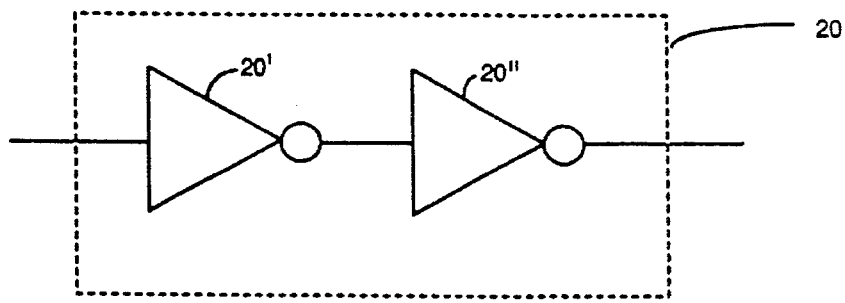
FIG. 1(b) is a schematic of a unit delay element.

With reference to FIG. 1(b), the unit time delay is illustrated as an even number plurality of inverters stages. Two units are shown in series, but it could be any even number of stages as required by the amount of delay that is required.

The number of stages in each delay block 1 and 2 is arbitrary except that total delay in a block should be less than the minimum expected time, $t_{min}$, between transitions of the input signal, i.e. $(x\Delta + t_{inverter}) < t_{min}$ where "x" is the total number of delay stages, and $\Delta$ is the unit stage delay.

Figure 3A:
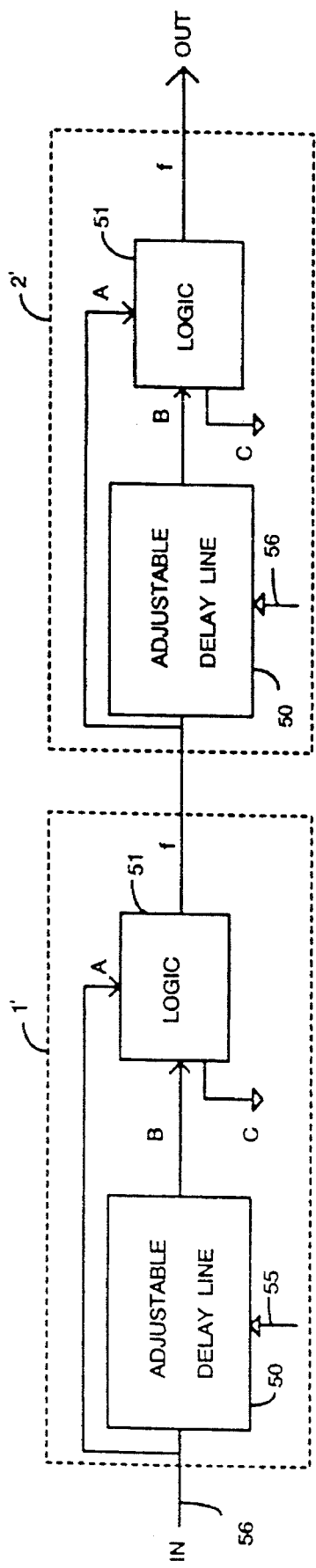
FIG. 3(a) is a schematic block diagram of an alternative embodiment of the invention.
Figure 3B:
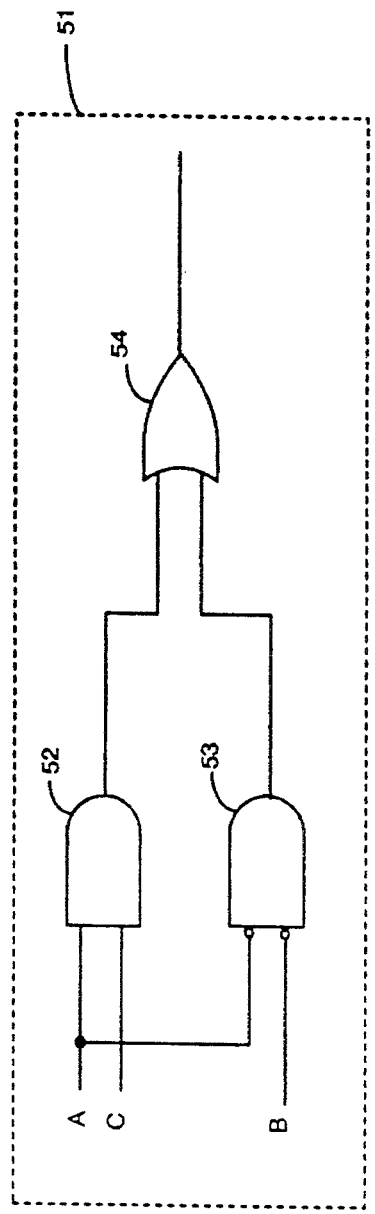
FIG. 3(b) is a logic circuit element of FIG. 3(a).

With reference to FIG. 3, the invention is more generally illustrated. Two identical delay blocks 1 and 2 are connected in series. Each block contains an adjustable delay 50 coupled to a combinatorial logic element 51. The combinatorial element 51 is illustrated in FIG. 3(b) and is shown preferably as two AND gates 52 and 53 coupled to and OR gate 54. If input C to the logic circuit 51 of block 1' is connected low (ground), then this circuit will provide the delay adjustments to the falling edge. The rising edge delay of any data signal provided to IN terminals 56 will be provided in the same manner as described in connection with FIG. 1(a).

This invention has been described in conjunction with the above preferred embodiments. However, the invention is not intended to be restricted to these embodiments and the scope of the invention shall be determined by the claims. With this in view:

I claim:

1. A digital data delay circuit for delaying a digital data signal having falling edge delay and rising edge delay comprising:

(a) a first delay block including an input terminal for receiving digital data to be shifted and a first output terminal, said first delay block including an adjustable delay line connected to said first input terminal, said adjustable delay line having selectable signal propagation delay therein and an output, wherein said first delay block further includes a first binary logic element wherein said first binary logic element has an A, B, and C inputs and an f output and wherein said A input is connected to said first input terminal of said first delay block and said B input is connected to said adjustable delay line output of said first delay block and wherein said f output is said first delay block output;

(b) a second delay block, said second delay block being identical to said first delay block and including a second input terminal and a second output terminal and a second adjustable delay line having selectable signal propagation delay therein, said second adjustable delay line being connected to said second input terminal, wherein said second delay block further includes a second binary logic element wherein said second binary logic element has an A, B, and C inputs and an f output and where said second binary logic element input A is connected to said second input terminal of said second delay block and to said f output of said first binary logic element and said B input of said second binary logic element is connected to said adjustable delay line output of said second delay block and wherein said f output is said second delay block output;

(c) means to connect the f output at said output terminal of said second input at said first delay block to said input terminal of said second delay block which is also said A input of said second binary logic element;

(d) first means to control said first adjustable delay line to select the propagation delay therein;

(e) second means to control said second adjustable delay line to select the propagation delay therein;

(f) said first means to control said first adjustable delay line and said second means to control said second adjustable delay line being independently adjustable; and (g) where said first and second binary logic elements each include means to cause said f output of both said first and second binary logic elements to be equal to its said B input if the A input is one binary logic state or to be equal to its said C input if the A input is the opposite binary logic state.

2. The circuit of claim 1 wherein said C input of both said first and second binary logic elements is connected to a logical low level.

3. The circuit of claim 1 wherein said first and second binary logic element is a multiplexer switch.

4. The circuit of claim 1 wherein said first and second binary logic element is a combinatorial circuit of AND gates and OR gates.

5. The circuit of claim 1 wherein said adjustable delay line comprises a plurality of identical cascaded delay circuit elements, wherein each said delay circuit element has an input and output, and wherein each said delay circuit element has an intrinsic delay and wherein said adjustable delay further includes a gate coupling the output of each said delay circuit element to the B input of said logic element connected to said adjustable delay line.

6. The circuit of claim 5 wherein said gates are IGFET circuits having drain, source and gates and wherein said gates are connected to said means to control the delay of said adjustable delay line.

7. The circuit of claim 6 wherein each cascaded delay circuit element is a pair of inverters in series.

* * * * *